United States Patent [19]
Son

[11] Patent Number: 5,881,011
[45] Date of Patent: Mar. 9, 1999

[54] MEMORY DEVICE FOR PERFORMING A REFRESH OPERATION UNDER AN ACTIVE MODE

[75] Inventor: Jin Seung Son, Ichon, Rep. of Korea

[73] Assignee: Hyundai Electronics Industries Co., Ltd., Rep. of Korea

[21] Appl. No.: 102,659

[22] Filed: Jun. 23, 1998

[30] Foreign Application Priority Data

Jun. 28, 1997 [JP] Japan ................. 1997 28680

[51] Int. Cl.⁶ ................. G11C 7/00; G11C 8/00
[52] U.S. Cl. ................. 365/222; 365/230.03
[58] Field of Search ................. 365/222, 230.03

[56] References Cited

U.S. PATENT DOCUMENTS

| | | | |
|---|---|---|---|
| 4,486,860 | 12/1984 | Takemae et al. | 365/222 |
| 4,907,199 | 3/1990 | Dosaka et al. | 365/189.04 |
| 5,253,211 | 10/1993 | Suzuki | 365/222 |
| 5,343,430 | 8/1994 | Furuyama | 365/201 |
| 5,347,491 | 9/1994 | Kagami | 365/222 |
| 5,566,118 | 10/1996 | Shimizu | 365/222 |
| 5,590,081 | 12/1996 | Shimizu | 365/201 |

*Primary Examiner*—David Nelms
*Assistant Examiner*—Trong Phan
*Attorney, Agent, or Firm*—Gary M. Nath; Nath & Associates

[57] ABSTRACT

A memory device does not operate an input/output sense-amplifier corresponding to a row to be refreshed, thus prevents a data mixing between a row of an active state and another row to be refreshed, thereby performing a refresh operation under an active mode. In addition, if the block of a row to be refreshed is not identical with other block of a row placed at an active state, the memory device performs a refresh operation under an active mode, thereby increasing an effective bandwidth of DRAM.

2 Claims, 4 Drawing Sheets

MEMORY DEVICE FOR PERFORMING A REFRESH OPERATION UNDER AN ACTIVE MODE

BACKGROUND OF THE INVENTION

1. Field of the Invention

The present invention relates to a memory device having a refresh function. More particularly, it relates to a memory device for performing a refresh operation under an active mode such as a read mode or a write mode.

2. Description of the Prior Art

In general, data stored in a memory cell within a memory device (particularly like a DRAM) are lost by a leakage current if a predetermined time lapses due to a incomplete capacitance component. At this time, if a re-write operation of rewriting the stored data is performed before the data are completely lost, the data are safely maintained, this is called a refresh operation.

FIG. 1 is a cell array structure of a conventional DRAM. In the conventional DRAM shown in FIG. 1, due to a data jam, a normal operation is not performed under an active mode such as a read mode or a write mode. In order to perform a refresh operation, the conventional DRAM stops the active mode and then performs the refresh operation. Accordingly, an effective bandwidth (i.e., an effective processing time) for a normal operation of a memory device becomes reduced.

SUMMARY OF THE INVENTION

Accordingly, the present invention is directed to a memory device for performing a refresh operation under an active mode that substantially obviates one or more of the problems due to limitations and disadvantages of the related art.

It is an objective of the present invention to provide a memory device for performing a refresh operation under an active mode such as a read mode or a write mode, thereby increasing an effective bandwidth of the memory device.

To achieve the above objective, a memory device for performing a refresh operation under an active mode in accordance with the present invention includes:

a plurality of cell array blocks in which each of cell arrays is divided into several cell arrays;

a plurality of sense-amplifier arrays which are positioned between the cell array blocks, sense data of the cell array blocks, and amplify the data;

a plurality of sense-amplifiers which are connected to each of sense-amplifier arrays;

a row decoder which is connected to the cell array block in order to select a row line of the cell array block; and a refresh signal generator for generating a refresh signal, wherein the refresh signal generator compares a first block address of a first row of an active state with a second block address of a second row to be refreshed, and then generates a refresh signal if there is a difference between the first and second block addresses, and wherein a row decoder of the second block address of the second row to be refreshed is enabled if the refresh signal is generated.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF THE PREFERRED EMBODIMENTS

Reference will now be made in detail to the preferred embodiments of the present invention, examples of which are illustrated in the accompanying drawings.

Figure 2:
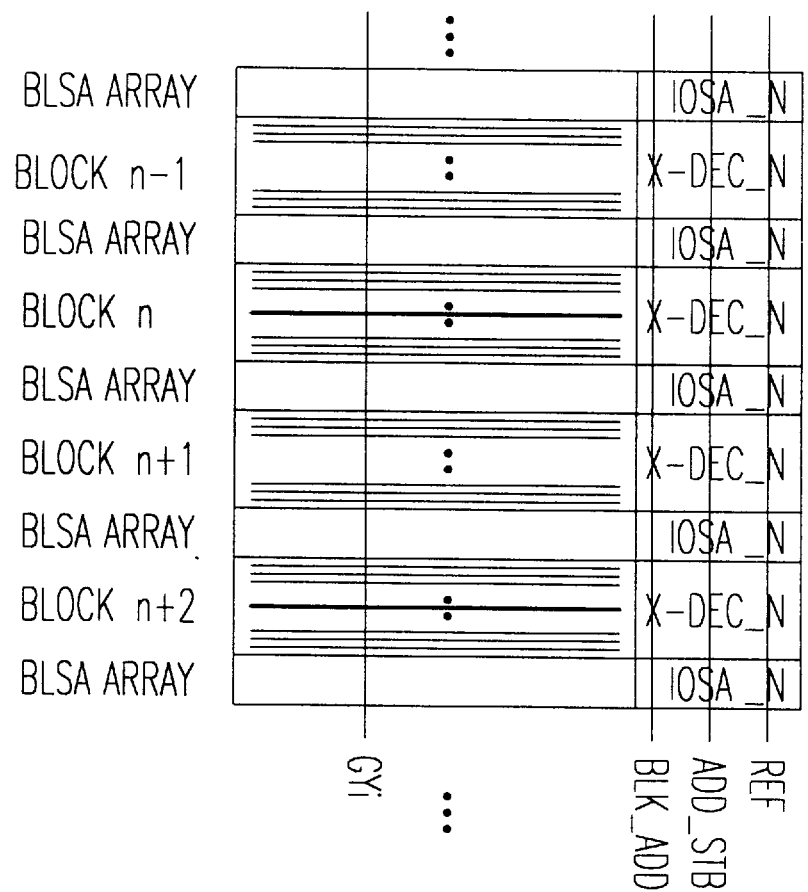
FIG. 2 is a memory structure in accordance with the present invention.

FIG. 2 is a structural diagram for explaining a memory device in accordance with the present invention.

As shown in FIG. 2, an input/output line sense-amplifier IOSA_N and an X decoder X_DEC_N in accordance with the present invention have the following characteristics as compared with the conventional input/output line sense-amplifier IOSA and the conventional X decoder X_DEC.

That is, if a refresh signal REF is input to the input/output line sense-amplifier IOSA_N during an active mode, the input/output line sense-amplifier IOSA_N operated by a block address signal BLK_ADD of the active mode is normally operated, but the input/output line sense-amplifier IOSA_N operated by a block address signal BLK_ADD being applied at an input time of the refresh signal REF is not operated.

At this time, X decoder X-DEC_N enables a row about a row address and a block address which are applied at the input time of the refresh signal REF.

Figure 3:
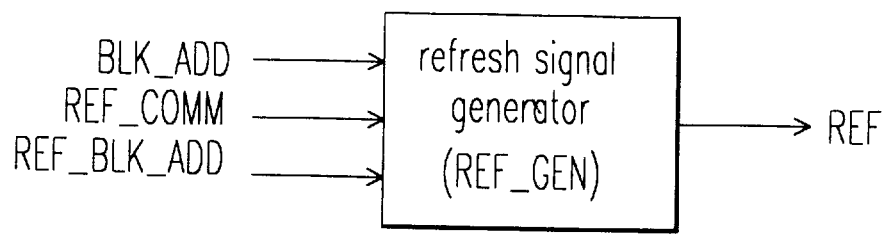
FIG. 3 is a block diagram of a refresh signal generator in accordance with the present invention.
Figure 4:
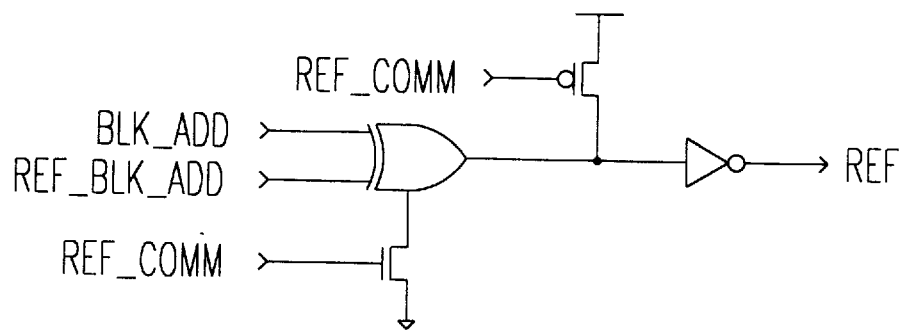
FIG. 4 is a circuit diagram of the refresh signal generator shown in FIG. 3.

A refresh signal generator for the memory of FIG. 2 is shown in FIGS. 3 and 4.

Referring to FIG. 3, when a refresh command signal REF_COMM is input under an active mode of DRAM, a refresh signal generator REF_GEN compares a block address signal BLK_ADD of a row of an active state with other block address signal REF_BLK_ADD of other row to be refreshed, and generates a refresh signal REF if there is a difference between the two block address signals BLK_ADD and REF_BLK_ADD.

FIG. 4 is an example of the refresh signal generator. The refresh signal generator shown in FIG. 4 includes:

an exclusive OR gate which compares a block address of a row of an active state with a block address of a row to be refreshed;

NMOS transistor for controlling an operation of the exclusive OR gate;

PMOS transistor which is connected between a power-supply voltage and an output terminal of the exclusive OR gate; and an inverter for inverting an output terminal of the exclusive OR gate.

A refresh command signal is applied to gate terminals of the NMOS transistor and the PMOS transistor.

That is, if there is an input of a refresh command signal REF_COMM, the refresh signal generator shown in FIG. 4 compares a block address signal BLK_ADD of a row of an active state with other block address signal RE_BLK_ADD of other row to be refreshed, and enables a refresh signal REF if there is a difference between the two block address signals BLK_ADD and REF_BLK_ADD. Such refresh signal generator is embodied by using an XOR gate in the present invention.

The refresh command signal REF_COMM is enabled only at an input time of a refresh command. If the refresh signal REF_COMM is enabled, the signal BLK_ADD is compared with another signal REF_BLK_ADD by XOR gate, such that the refresh signal REF is enabled only in the case that the signal BLK_ADD is different from the signal REF_BLK_ADD.

On the contrary, if the refresh command signal REF_COMM is disabled, NMOS transistor is turned off and PMOS transistor is turned on, so that the refresh signal REF is disabled regardless of the signals BLK_ADD and REF_BLK_ADD.

Figure 5:
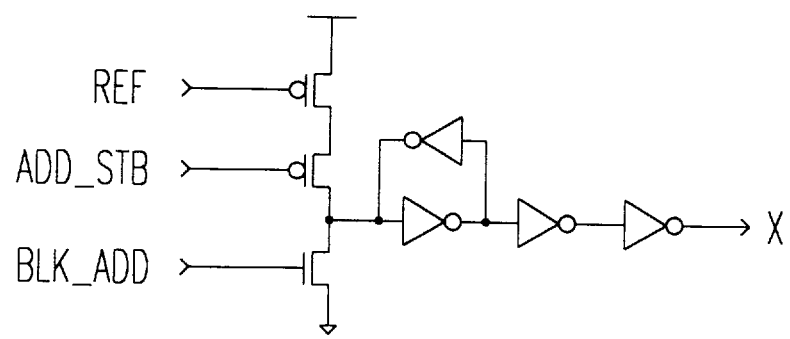
FIG. 5 is a row decoder in accordance with the present invention.

FIG. 5 is a preferred embodiment of a X-DEC_N shown in FIG. 2. Referring to FIG. 5, a signal ADD_STB is enabled only in a case of an address strobe in a normal operation. Other input signals REF and BLK_ADD shown in FIG. 5 are identical with those of FIGS. 3 and 4, so that descriptions for them will be omitted below.

In operation, a PMOS transistor for receiving a refresh signal REF via a gate terminal is turned on because the refresh signal REF is disabled in a normal operation. And, in a case of an address strobe (i.e., in case that the signal ADD_STB is enabled), a signal BLK_ADD is received.

A second PMOS transistor for receiving the signal ADD_STB via a gate terminal is turned on because the signal ADD_STB is disabled in a refresh operation. In this case, the signal BLK_ADD is received if the refresh signal REF is enabled.

Figure 6:
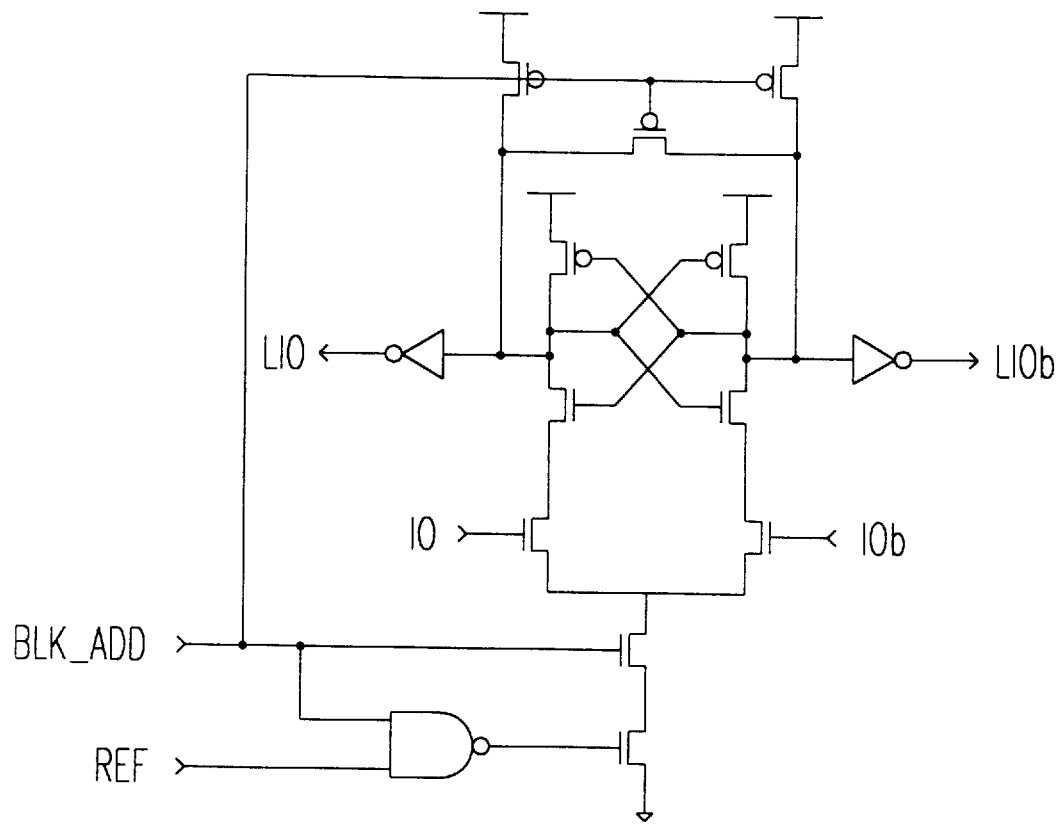
FIG. 6 is an input/output sense-amplifier in accordance with the present invention.

FIG. 6 is a preferred embodiment of an input/output line sense-amplifier IOSA_N shown in FIG. 2.

Referring to FIG. 6, the input/output line sense-amplifier IOSA_N includes a differential amplifier having a latch circuit, and a NAND gate for controlling an operation of the differential amplifier. In operation, by an operation of the NAND gate receiving the signals REF and BLK_ADD, the sense-amplifier IOSA_N corresponding to the signal BLK_ADD is not operated during a refresh operation.

Based on the above operations, an operation of the present invention shown in FIG. 2 will now be synthetically described below.

Let us suppose that a refresh command signal REF_COMM is received when a memory device according to the present invention is at an active mode of a block N in FIG. 2.

Figure 1:
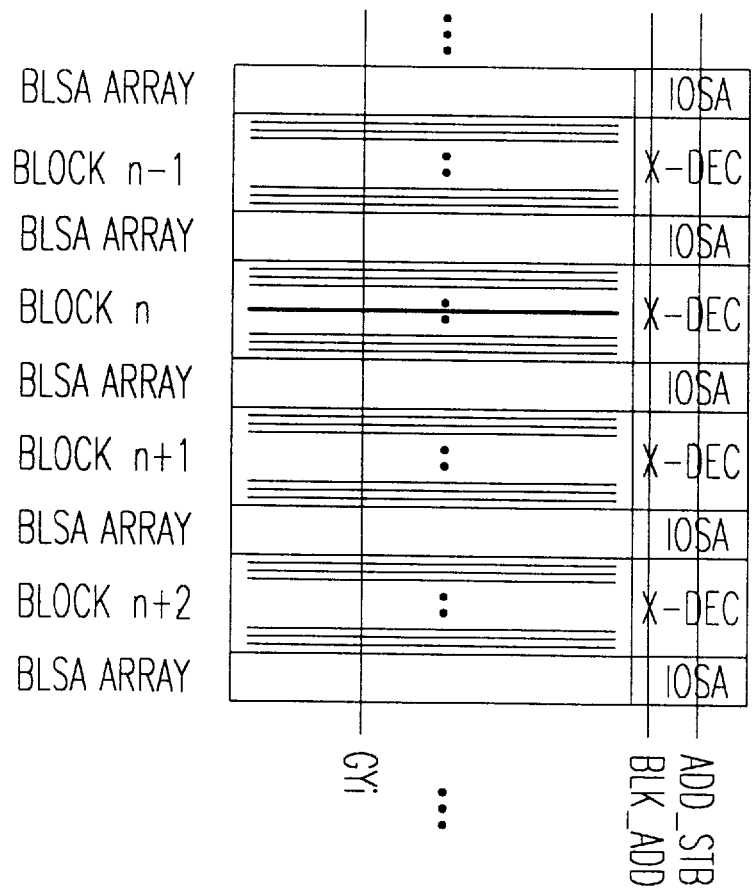
FIG. 1 is a cell array structure of a conventional DRAM.

At this time, if a first block address of a row to be refreshed is not identical with a second block address of a row placed at an active state and is not adjacent to the second block address of the active state row, the conventional memory device shown in FIG. 1 cannot perform a refresh operation because of a data jam (i.e., a data mixing).

However, in the memory device shown in FIG. 2 in accordance with the present invention, if a first block address of a row to be refreshed is not identical with a second block address of a row placed at an active state and is not adjacent to the second block address of the active state row, a refresh signal REF is enabled, and a signal IOSA_N corresponding to a signal BLK_ADD is not operated. Therefore, although the refresh operation is performed in the memory device according to the present invention, data of the row placed at an active state are not mixed with other data of the other row to be refreshed.

As described above, the memory device according to the present invention does not operate an input/output sense-amplifier corresponding to a row to be refreshed, thus prevents a data mixing between a row of an active state and another row to be refreshed, thereby performing a refresh operation under an active mode.

In addition, if a first block of a row to be refreshed is not identical with a second block of a row placed at an active state and is not adjacent to the second block, the memory device according to the present invention performs a refresh operation under an active mode, thereby increasing an effective bandwidth of DRAM.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. In a memory device having memory cell arrays, a memory device for performing a refresh operation under an active mode, comprising:

a plurality of cell array blocks in which each of memory cell arrays is divided into several cell arrays;

a plurality of sense-amplifier arrays which are positioned between the cell array blocks, sense data of the cell array blocks, and amplify the data;

a plurality of sense-amplifiers which are connected to each of sense-amplifier arrays;

a row decoder which is connected to the cell array block in order to select a row line of the cell array block; and a refresh signal generator for generating a refresh signal, wherein the refresh signal generator compares a first block address of a first row of an active state with a second block address of a second row to be refreshed, and then generates a refresh signal if there is a difference between the first and second block addresses, and wherein a row decoder of the second block address of the second row to be refreshed is enabled if the refresh signal is generated.

2. A memory device for performing a refresh operation under an active mode as set forth in claim 1, wherein the refresh signal generator comprises:

an exclusive OR gate which compares the first block address of a row of an active state with the second block address of a row to be refreshed;

NMOS transistor for controlling an operation of the exclusive OR gate;

PMOS transistor which is connected between a power-supply voltage and an output terminal of the exclusive OR gate; and an inverter for inverting an output terminal of the exclusive OR gate, wherein a refresh command signal is applied to gate terminals of the NMOS transistor and the PMOS transistor.

* * * * *